(12) United States Patent
Nakamura

(10) Patent No.: US 8,456,343 B2
(45) Date of Patent: Jun. 4, 2013

(54) SWITCHED CAPACITOR TYPE D/A CONVERTER

(75) Inventor: Kei Nakamura, Kyoto (JP)

(73) Assignee: Rohm Co., Ltd. (JP)

( * ) Notice: Subject to any disclaimer, the term of this patent is extended or adjusted under 35 U.S.C. 154(b) by 150 days.

(21) Appl. No.: 13/179,660

(22) Filed: Jul. 11, 2011

(65) Prior Publication Data

US 2012/0013496 A1     Jan. 19, 2012

(30) Foreign Application Priority Data

Jul. 15, 2010   (JP) .................................. 2010-160735

(51) Int. Cl.
*H03M 1/12* (2006.01)
(52) U.S. Cl.
USPC ........... 341/150; 341/144; 341/151; 327/553; 327/100; 327/113; 327/541; 327/543; 331/111; 331/44; 331/143; 331/177 R; 324/548; 324/549
(58) Field of Classification Search
USPC .................. 341/120–155; 327/100, 113, 541, 327/543, 553
See application file for complete search history.

(56) References Cited

U.S. PATENT DOCUMENTS

| | | | | |
|---|---|---|---|---|
| 4,584,568 A | * | 4/1986 | Zomorrodi | 341/150 |
| 4,706,066 A | * | 11/1987 | Dijkmans | 341/166 |
| 5,332,997 A | * | 7/1994 | Dingwall et al. | 341/150 |
| 5,376,936 A | * | 12/1994 | Kerth et al. | 341/150 |
| 5,892,473 A | * | 4/1999 | Shin | 341/150 |
| 6,046,719 A | * | 4/2000 | Dingwall | 345/100 |
| 6,081,218 A | * | 6/2000 | Ju et al. | 341/150 |
| 6,154,162 A | * | 11/2000 | Watson et al. | 341/150 |
| 6,600,437 B1 | * | 7/2003 | Confalonieri et al. | 341/150 |
| 6,924,760 B1 | * | 8/2005 | McLeod et al. | 341/144 |
| 7,102,557 B1 | * | 9/2006 | Frith | 341/150 |
| 7,425,913 B2 | * | 9/2008 | Wu et al. | 341/150 |

FOREIGN PATENT DOCUMENTS

| | | | |
|---|---|---|---|
| JP | 2001111427 A | 4/2001 |
| JP | 2003283337 A | 10/2003 |

* cited by examiner

*Primary Examiner* — Lam T Mai
(74) *Attorney, Agent, or Firm* — Cantor Colburn LLP

(57) ABSTRACT

A switched capacitor type D/A converter receives m-bit (m represents an integer) input data, and outputs an analog signal that corresponds to the input data value. Switch circuits are provided to respective bits of the input data, and are classified into two groups: a first group configured to turn on when the corresponding input data bit is 1, and to turn off when the corresponding input data bit is 0; and a second group configured to turn on when the corresponding input data bit is 0, and to turn off when the corresponding input data bit is 1. Each switch of the first and second switch groups is configured as a P-channel MOSFET (Metal Oxide Semiconductor Field Effect Transistor). The ground voltage 0 V is applied to the lower power supply terminal of each of the first and second inverters configured to supply a gate signal to each switch.

8 Claims, 5 Drawing Sheets

SWITCHED CAPACITOR TYPE D/A CONVERTER

BACKGROUND OF THE INVENTION

1. Field of the Invention

The present invention relates to a switched capacitor type D/A converter.

2. Description of the Related Art

As a D/A converter configured to convert a digital signal into an analog signal, a switched capacitor type D/A converter is known. Such a switched capacitor type D/A converter receives N-bit data, and outputs an analog signal having a voltage level that corresponds to the data thus received.

The D/A converter includes a switch configured to be controlled to turn on/off in synchronization with a clock signal, and switches each configured to be controlled to turn on/off according to a corresponding bit of digital data. As disclosed in Patent document 2, typical switched capacitor type D/A converters employ, as such a switch, an N-channel MOSFET (Metal Oxide Semiconductor Field Effect Transistor) or a transfer gate using such an N-channel MOSFET.

RELATED ART DOCUMENTS

Patent Documents

[Patent Document 1]
Japanese Patent Application Laid Open No. 2003-283337
[Patent Document 2]
Japanese Patent Application Laid Open No. 2001-111427

The present inventor has investigated such a switched capacitor type D/A converter including such N-channel MOSFETs as such switches, and has come to recognize the following problems.

FIG. 1 is a circuit diagram which shows a part of a configuration of a switched capacitor type D/A converter.

The switches included in the switched capacitor type D/A converter can be classified into two groups: a first switch group M11, which are configured to turn on when the corresponding bit of a digital signal is 1; and a second switch group M12, which are configured to turn on when the corresponding bit of the digital signal is 0. With such an arrangement, gate signals G1 and G2, which are respectively transmitted via inverters 502 and 504, are supplied to the first switch group M11 and the second switch group M12, respectively.

With such an N-channel MOSFET, when a high-level voltage is applied to its gate, the N-channel MOSFET is turned on, and a low-level voltage is applied to its gate, the N-channel MOSFET is turned off. With the gate signals G1 and G2, which are respectively output from the inverters 502 and 504, the power supply voltage Vdd is used as a high-level voltage, and the ground voltage Vgnd is used as a low-level voltage. Accordingly, the on resistance of each switch depends on the power supply voltage Vdd. That is to say, if noise is superimposed on the power supply voltage Vdd, the on resistance of each switch fluctuates, leading to a problem of deterioration in the power supply rejection ratio (PSRR) of the D/A converter.

In a case in which the output voltage of a DC/DC converter such as a charge pump circuit, a switching regulator, or the like, is used as the power supply voltage Vdd, such deterioration in the PSRR is particularly conspicuous. If such a D/A converter is used to perform audio signal processing, such an arrangement leads to a problem of deterioration in the sound quality.

SUMMARY OF THE INVENTION

The above-described consideration is by no means within the scope of common and general knowledge in the field of the present invention. Furthermore, it can be said that the present applicant has been the first to arrive at this consideration.

The present invention has been made in order to solve such a problem. Accordingly, it is an exemplary purpose of the present invention to provide a switched capacitor type D/A converter having an improved PSRR.

An embodiment of the present invention relates to a switched capacitor type D/A converter configured to receive m-bit (m represents an integer) input data, and to output an analog signal that corresponds to the value of the input data. The switched capacitor type D/A converter comprises: m switch circuits provided to respective bits of the input data, each switch circuit comprising a first switch group and a second switch group, each switch in the first switch group being on state when the corresponding bit of the input data is 1 and being off state when the corresponding bit of the input data is 0, each switch in the second switch group being on state when the corresponding bit of the input data is 0 and being off state when the corresponding bit of the input data is 1; a first inverter configured to output a gate signal to each switch in the first switch group; and a second inverter configured to output a gate signal to each switch in the second switch group. Each switch in the first switch group and the second switch group is configured as a P-channel MOSFET (Metal Oxide Semiconductor Field Effect Transistor). The ground voltage is applied to a lower power supply terminal of each of the first inverter and the second inverter.

With such an embodiment, the ground voltage is applied to the gate of each P-channel MOSFET during a period in which the P-channel MOSFET is to be turned on. Thus, fluctuation in the power supply voltage has almost no effect on the on resistance of each of such switches. This provides an improved PSRR.

Also, the back gate of the P-channel MOSFET may be fixed at an electric potential that is lower than the voltage to be input to an upper power supply terminal of each of the first inverter and the second inverter.

The on resistance of each P-channel MOSFET is higher than the on resistance of an N-channel MOSFET. Accordingly, by fixing the back gate of such a P-channel MOSFET at a voltage that is lower than the power supply voltage, instead of being fixed at the power supply voltage, such an arrangement provides a reduction in the on resistance of such a P-channel MOSFET, thereby compensating for the disadvantage of employing such a P-channel MOSFET.

Also, an output voltage of a DC/DC converter may be supplied to an upper power supply terminal of each of the first inverter and the second inverter.

Switching noise is superimposed on the output voltage of the DC/DC converter. However, by employing a P-channel MOSFET as such a switch, such an arrangement provides an advantage of the PSRR characteristics not being subjected to the effects of such switching noise.

Another embodiment of the present invention also relates to a switched capacitor type D/A converter. The switched capacitor type D/A converter comprises: m switch circuits provided to respective bits of the input data, each switch circuit comprising a first switch group and a second switch group, each switch in the first switch group being on state when the corresponding bit of the input data is 1 and being off state when the corresponding bit of the input data is 0, each switch in the second switch group being on state when the corresponding bit of the input data is 0 and being off state when the corresponding bit of the input data is 1; a first inverter configured to output a gate signal to each switch in the first switch group; a second inverter configured to output a gate signal to each switch in the second switch group; a band gap reference circuit configured to generate a reference voltage; and a linear regulator configured to output a voltage that corresponds to the reference voltage. Each switch in the first switch group and the second switch group is configured as an N-channel MOSFET (Metal Oxide Semiconductor Field Effect Transistor). The output voltage of the linear regulator is supplied to an upper power supply terminal of each of the first inverter and the second inverter.

The linear regulator is configured to generate a voltage according to the reference voltage received from the band gap reference circuit. Accordingly, the output voltage is provided with a high PSRR. Accordingly, the high level voltage of the gate signal output from each of the first and second inverters is provided with a high PSRR. Thus, such an arrangement is capable of suppressing fluctuation in the on resistance of each switch even if an N-channel MOSFET is employed as such a switch. Thus, such an arrangement is capable of suppressing deterioration in the PSRR of the D/A converter, or provides an improved PSRR.

Yet another embodiment of the present invention also relates to a switched capacitor type D/A converter. The switched capacitor type D/A converter comprises: m switch circuits provided to respective bits of the input data, each switch circuit comprising a first transfer gate group and a second transfer gate group, each transfer gate in the first transfer gate group being on state when the corresponding bit of the input data is 1 and being off state when the corresponding bit of the input data is 0, each transfer gate in the second transfer gate group being on state when the corresponding bit of the input data is 0 and being off state when the corresponding bit of the input data is 1; a first inverter configured to output a gate signal to each N-channel MOSFET in the first transfer gate group and each P-channel MOSFET in the second transfer gate group; a second inverter configured to output a gate signal to each P-channel MOSFET in the first transfer gate group and each N-channel MOSFET in the second transfer gate group; a band gap reference circuit configured to generate a reference voltage; and a linear regulator configured to receive the reference voltage. The ground voltage is applied to a lower power supply terminal of each of the first inverter and the second inverter. The output voltage of the linear regulator is applied to an upper power supply terminal of each of the first inverter and the second inverter.

Such an embodiment is capable of suppressing fluctuation in the on resistance of each of the P-channel MOSFETs and the N-channel MOSFETs. Thus, such an arrangement is capable of suppressing deterioration in PSRR of the D/A converter, or provides an improved PSRR.

Also, the input data may be in the form of a digital audio signal.

With the D/A converter according to any one of the aforementioned embodiments, such an arrangement provides high-quality audio signal processing.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

[First Embodiment]

Figure 2:
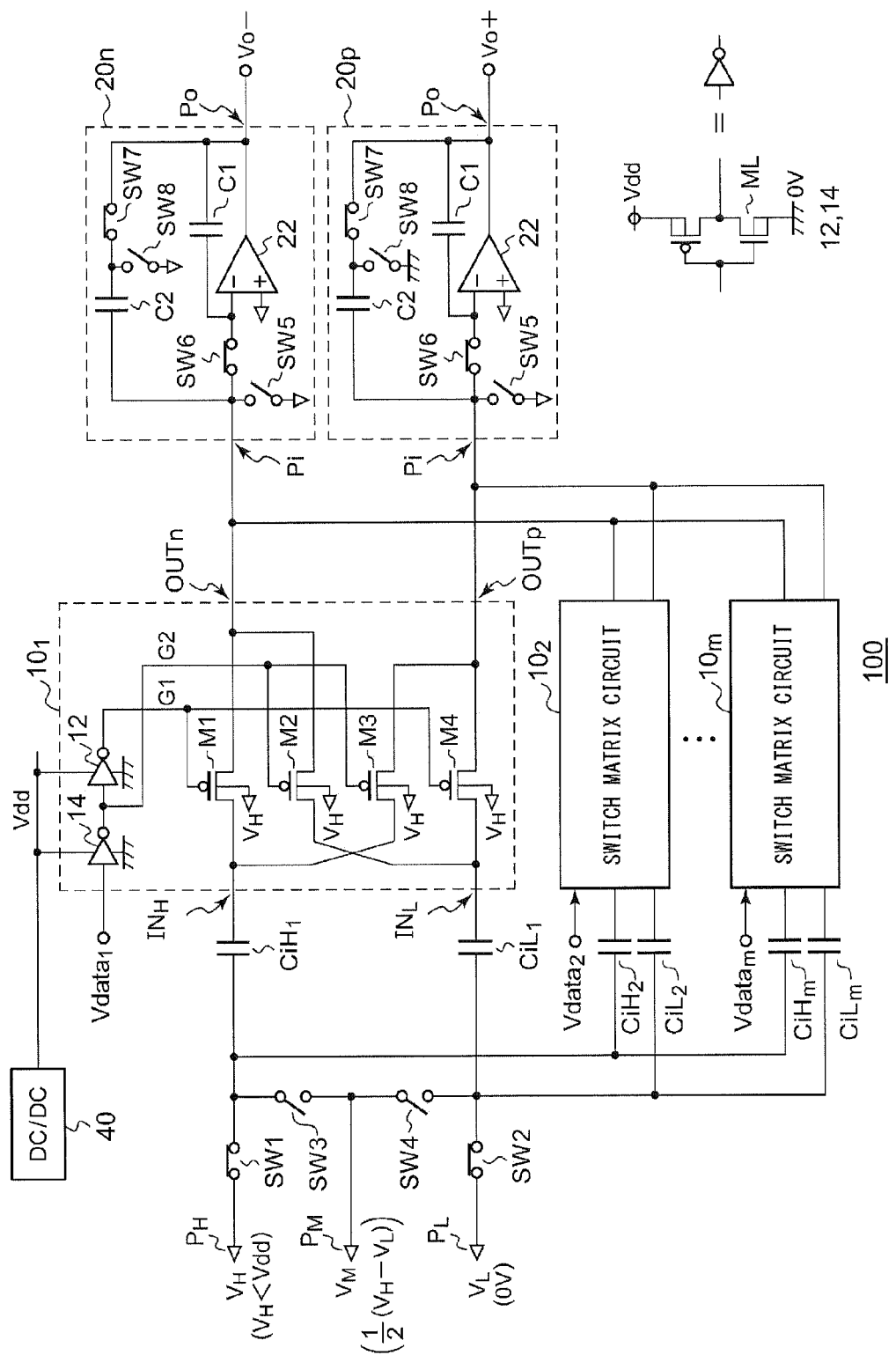
FIG. 2 is a circuit diagram which shows a configuration of a switched capacitor type D/A converter according to a first embodiment.

FIG. 2 is a circuit diagram which shows a configuration of a switched capacitor type D/A converter 100 according to a first embodiment.

The D/A converter 100 receives m-bit (m represents an integer) input data $Vdata_1$ through $Vdata_m$, and outputs a differential analog signal that corresponds to the value of the input data thus received. Examples of such input data include a digital audio signal.

The D/A converter 100 includes m switch circuits $10_1$ through $10_m$ provided to the respective bits $Vdata_1$ through $Vdata_m$ of the input data, m input capacitor pairs $(CiH/CiL)_1$ through $(CiH/CiL)_m$ provided to the respective bits $Vdata_1$ through $Vdata_m$, switches SW1 through SW4, a first calculation unit 20p, and a second calculation unit 20n.

An upper reference voltage $V_H$, a middle reference voltage $V_M$, and a lower reference voltage $V_L$ are supplied to the respective terminals $P_H$, $P_M$, and $P_L$ of the D/A converter 100.

The switch circuits $10_1$ through $10_m$ are each configured in the same way. Accordingly, directing attention to the switch circuit $10_1$ provided for the first bit, description will be made regarding the configuration of the switch circuit 10. The switch circuit 10 includes a first input terminal $IN_H$, a second input terminal $IN_L$, a first output terminal OUTp, and a second output terminal OUTn.

When the data $Vdata_i$ is 1 (high level), the switch circuit $10_i$ connects the first output terminal OUTp and the first input terminal $IN_H$, and connects the second output terminal OUTn and the second input terminal $IN_L$.

Conversely, when the data $Vdata_i$ is 0 (low level), the switch circuit $10_i$ connects the first output terminal OUTp and the second input terminal $IN_L$, and connects the second output terminal OUTn and the first input terminal $IN_H$.

The switch circuit $10_i$ includes a first switch group and a second switch group. The first switch group comprises switches M1 and M4 which are on-state when the corresponding bit $Vdata_i$ of the input data is 1 and are off-state when the corresponding bit $Vdata_i$ of the input data is 0. The second switch group comprises switches M2 and M3 which are on-state when the corresponding bit $Vdata_i$ is 0 and off-state when the corresponding bit $Vdata_i$ of the input data is 1.

With the present embodiment, the switches M1 through M4 are each configured as a P-channel MOSFET. The second inverter 14 inverts $Vdata_i$, and supplies the data thus inverted as a gate signal to the switches M2 and M3 of the second switch group. The first inverter 12 inverts the output signal of the second inverter 14, and supplies the output signal thus inverted as a gate signal to the switches M1 and M4 of the first switch group.

As shown in the lower-right part of FIG. 2, the ground voltage (0 V) is applied to the lower power supply terminal of each of the first inverter 12 and the second inverter 14. Furthermore, the power supply voltage Vdd is applied to the upper power supply terminal of each of the first inverter 12 and the second inverter 14. The power supply voltage Vdd is generated by a DC/DC converter 40.

The back gate of the P-channel MOSFET is fixed at a voltage $V_H$ that is lower than the voltage Vdd input to the upper power supply voltage terminals of the first inverter 12 and the second inverter 14.

The first terminals of input capacitors $CiH_1$ through $CiH_m$ are connected together so as to form a common first terminal. Furthermore, the second terminal of the input capacitor $CiH_i$ is connected to the first input terminal $IN_H$ of the switch circuit $10_i$. The first terminals of input capacitors $CiL_1$ through $CiL_m$ are connected together so as to form a common first terminal. Furthermore, the second terminal of the input capacitor $CiL_i$ is connected to the second input terminal $IN_L$ of the switch circuit $10_i$.

The D/A converter 100 alternately repeats a first state $\phi1$ and a second state $\phi2$ in synchronization with a clock signal. FIG. 2 shows the on/off state of each switch in the first state $\phi1$. That is to say, each switch in the off state shown in FIG. 2 is turned on in the second state $\phi2$.

The first switch SW1 is arranged between the common first terminal formed by connecting together the first terminals of the input capacitors $CiH_1$ through $CiH_m$ and a terminal $P_H$ to which the upper reference voltage $V_H$ is to be applied. The third switch SW3 is arranged between the common first terminal formed by connecting together the first terminals of the input capacitors $CiH_1$ through $CiH_m$ and a terminal $P_M$ to which the middle reference voltage $V_M$ is to be applied.

The second switch SW2 is arranged between the common first terminal formed by connecting together the first terminals of the input capacitors $CiL_1$ through $CiL_m$ and a terminal $P_L$ to which the lower reference voltage $V_L$ is to be applied. The fourth switch SW4 is arranged between the common first terminal formed by connecting together the first terminals of the input capacitors $CiL_1$ through $CiL_m$ and the terminal $P_M$ to which the middle reference voltage $V_M$ is to be applied.

The input terminal Pi of the first calculation unit 20p is connected to a common first output terminal formed by connecting together the first output terminals OUTp of the switch circuit $10_1$ through $10_m$. The first calculation unit 20p includes an operational amplifier 22, a first capacitor C1, a second capacitor C2, and a fifth switch SW5 through an eighth switch SW8.

A reference voltage is input to the non-inverting input terminal of the operational amplifier 22. The fifth switch SW5 is arranged between the input terminal Pi and the reference voltage terminal. The sixth switch SW6 is arranged between the inverting input terminal of the operational amplifier 22 and the input terminal Pi. The first capacitor C1 is arranged between the inverting input terminal of the operational amplifier 22 and the output terminal thereof. The seventh switch SW7 and the second capacitor C2 are sequentially arranged in series between the output terminal of the operational amplifier 22 and the input terminal Pi thereof. The eighth switch SW8 is arranged between the reference voltage terminal and a connection node that connects the seventh switch SW7 and the second capacitor C2.

The second calculation unit 20n is configured in the same way as the first calculation unit 20p. The input terminal Pi of the second calculation unit 20n is connected to a common second output terminal formed by connecting together the second output terminals OUTn of the switch circuit $10_1$ through $10_m$.

The above is the configuration of the D/A converter 100. Next, description will be made regarding the operation thereof.

When the gate signal received from the inverter 12 or 14 is low level, i.e., the gate signal is set to the ground voltage 0V, the switch groups M1 through M4, each configured as a P-channel MOSFET, are turned on. Even if the power supply voltage Vdd fluctuates, such fluctuation in the power supply voltage Vdd has no effect on the ground voltage 0 V, or, even if there is such an effect, it is miniscule.

That is to say, there is almost no fluctuation in the on resistance of each of the switch groups M1 through M4 even if the power supply voltage Vdd fluctuates.

Figure 1:
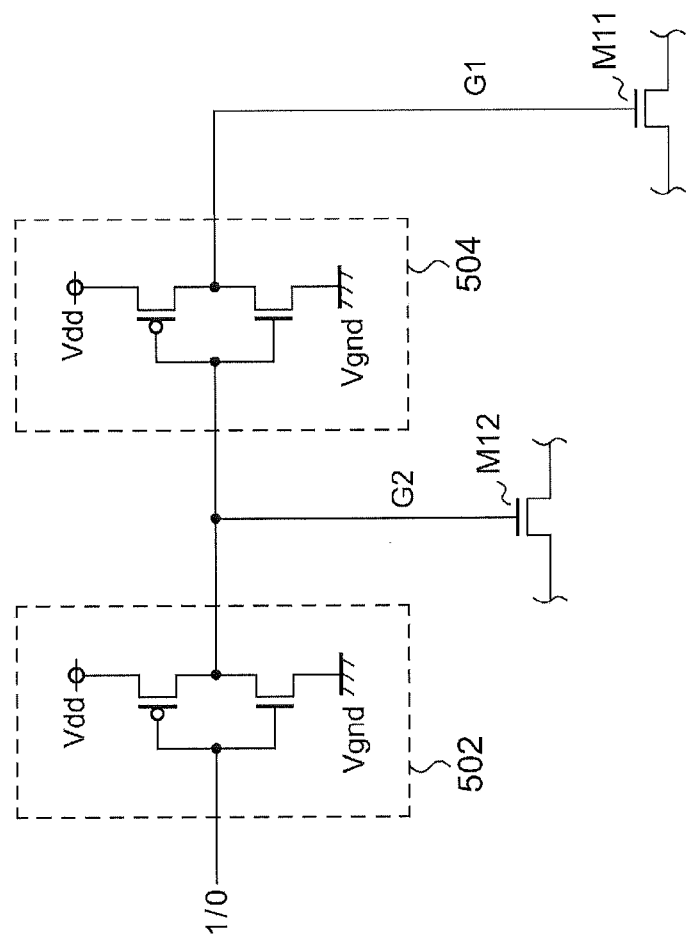
FIG. 1 is a circuit diagram which shows a part of a configuration of a switched capacitor type D/A converter.

Thus, with such a D/A converter 100 shown in FIG. 1, such an arrangement provides improvement in the PSRR characteristics, as compared with an arrangement employing N-channel MOSFETs as the switches M1 through M4. Specifically, in a case in which N-channel MOSFETs are employed as the switches M1 through M4, such an arrangement provides a PSRR on the order of 60 dB. In contrast, such an arrangement employing P-channel MOSFETs as the switches M1 through M4 provides an improved PSRR on the order of 90 dB, which is a notable advantage.

As can be understood from the above description, in particular, such a D/A converter 100 is suitably used to perform audio signal processing that requires a particularly high PSRR.

However, the on resistance of a P-channel MOSFET is greater than that of an N-channel MOSFET of the same size. Accordingly, if there is a desire to provide the same on resistance as that of an N-channel MOSFET, there is a need to form such a P-channel MOSFET with a larger area.

With typical arrangements, the power supply voltage Vdd is applied to the back gate of such a P-channel MOSFET. In contrast, in the D/A converter 100 shown in FIG. 2, a voltage that is lower than the power supply voltage Vdd, specifically, the upper reference voltage $V_H$, is applied to the back gate of each of the switches M1 through M4. Such an arrangement provides a reduction in the on resistance of each P-channel MOSFET. Thus, such an arrangement does not require such a P-channel MOSFET to have such a large area, thereby providing a reduced circuit area.

As described above, the on resistance of each of the transistors M1 through M4 is not subjected to the effects of the power supply voltage Vdd. Thus, such an arrangement allows the output voltage of a DC/DC converter having a large amount of fluctuation to be employed as the power supply voltage Vdd. The DC/DC converter has a conversion efficiency that is higher than that of a linear regulator. Thus, by employing such a D/A converter 100, such an arrangement provides reduced overall power consumption of the system.

[Second Embodiment]

Description will be made in the second embodiment regarding a technique for providing an improved PSRR by means of an approach that differs from that used in the first embodiment.

Figure 3:
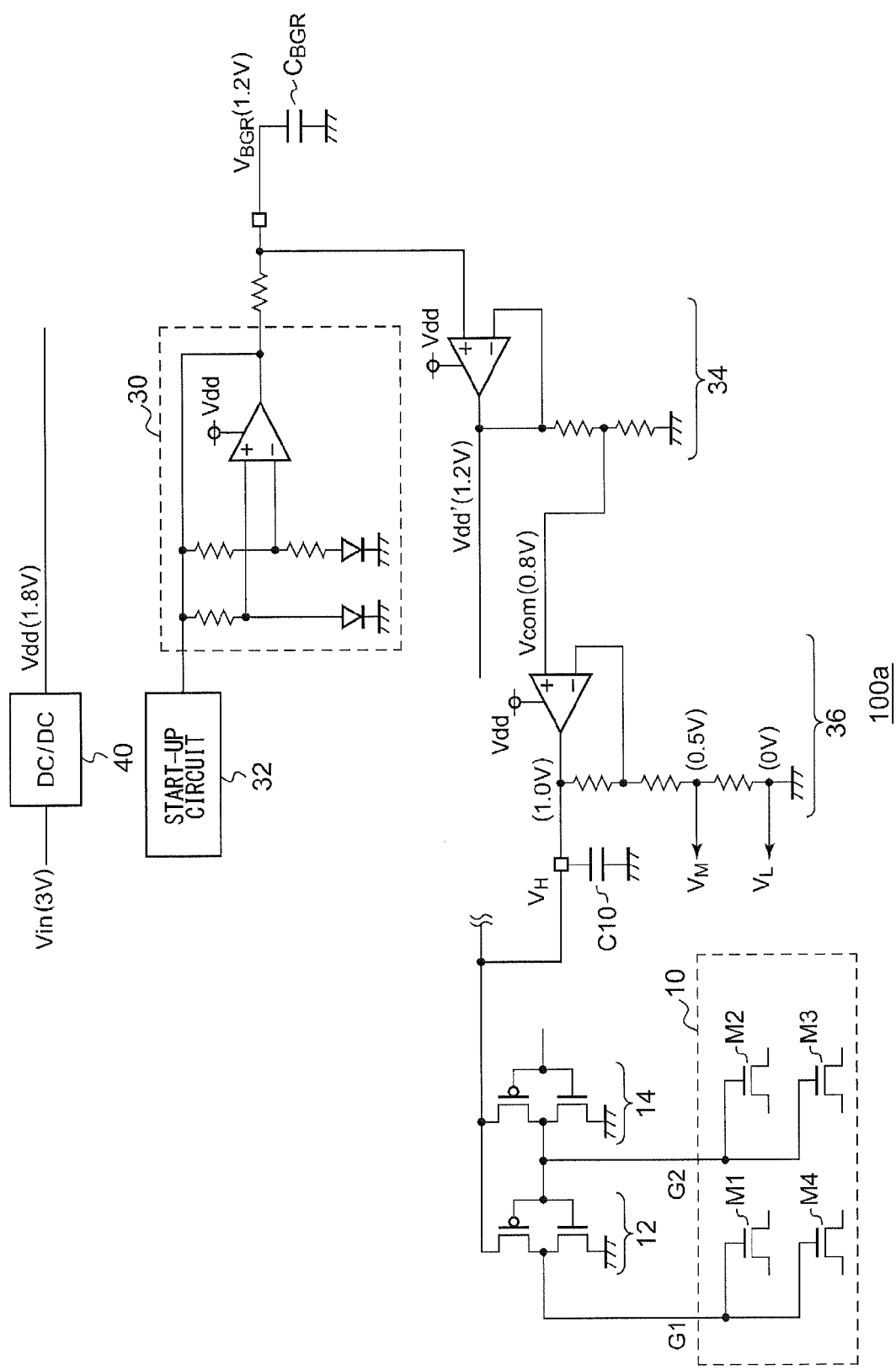
FIG. 3 is a circuit diagram which shows a configuration of a power supply unit of a D/A converter according to a second embodiment.

FIG. 3 is a circuit diagram which shows a configuration of a power supply unit of a D/A converter 100a according to a second embodiment. In the second embodiment, switches M1 through M4, which compose a switch circuit 10 of the D/A converter 100a, are each configured as an N-channel MOSFET.

A power supply unit of the D/A converter 100a includes a DC/DC converter 40, a band gap reference circuit 30, a start-up circuit 32, a first linear regulator 34, and a second linear regulator 36.

The DC/DC converter 40 is configured to receive an input voltage on the order of 3 V, and converts the input voltage thus received into a power supply voltage Vdd on the order of 1.8 V. The input voltage may be supplied as a battery voltage, for example.

The band gap reference circuit 30 generates a reference voltage $V_{BGR}$ on the order of 1.2 V. The start-up circuit 32 is arranged in order to start up the band gap reference circuit 30. The band gap reference circuit 30 and the start-up circuit 32 should be configured using known techniques. A capacitor $C_{BGR}$ is connected to the output terminal of the band gap reference circuit 30. It should be noted that the power supply voltage Vdd may be supplied to the power supply terminal of an error amplifier EA of the band gap reference circuit 30. Also, a second power supply voltage Vdd', which is generated by the first linear regulator 34 arranged as a downstream component, may be supplied to the power supply terminal of the error amplifier EA.

The first linear regulator 34 includes a voltage follower configured to receive the reference voltage $V_{BGR}$, and to generate a second power supply voltage Vdd' on the order of 1.2 V. The second power supply voltage Vdd' is supplied to the upper power supply terminal of each of the first inverter 12 and the second inverter 14. Furthermore, the first linear regulator 34 divides the second power supply voltage Vdd' so as to generate a common voltage $V_{com}$.

The second linear regulator 36 receives the common voltage $V_{com}$, and generate an upper reference voltage $V_H$, a middle reference voltage $V_M$, and a lower reference voltage $V_L$. A smoothing capacitor C10 is externally connected to a terminal of the second linear regulator 36 at which the upper reference voltage $V_H$ develops. The upper reference voltage $V_H$ is supplied to the upper power supply terminal of each of the first inverter 12 and the second inverter 14.

The above is the configuration of the D/A converter 100a. The upper reference voltage $V_H$ is generated by the first linear regulator 34 and the second linear regulator 36 based on the reference voltage $V_{BGR}$. Thus, the upper reference voltage $V_H$ thus generated is not subject to the effects of fluctuation in the power supply voltage Vdd, thereby providing a stable voltage level. Thus, such fluctuation in the power supply voltage Vdd has almost no effect on the on resistances of the transistors M1 through M4 each configured as an N-channel MOSFET.

With such a D/A converter 100a shown in FIG. 3, such an arrangement provides improved PSRR even if the switches M1 through M4 are each configured as an N-channel MOSFET.

It should be noted that, with the first embodiment, the second power supply voltage Vdd' generated by the first linear regulator 34 shown in FIG. 3 may be supplied to the upper power supply terminal of each of the first inverter 12 and the second inverter 14.

[Third Embodiment]

Figure 4:
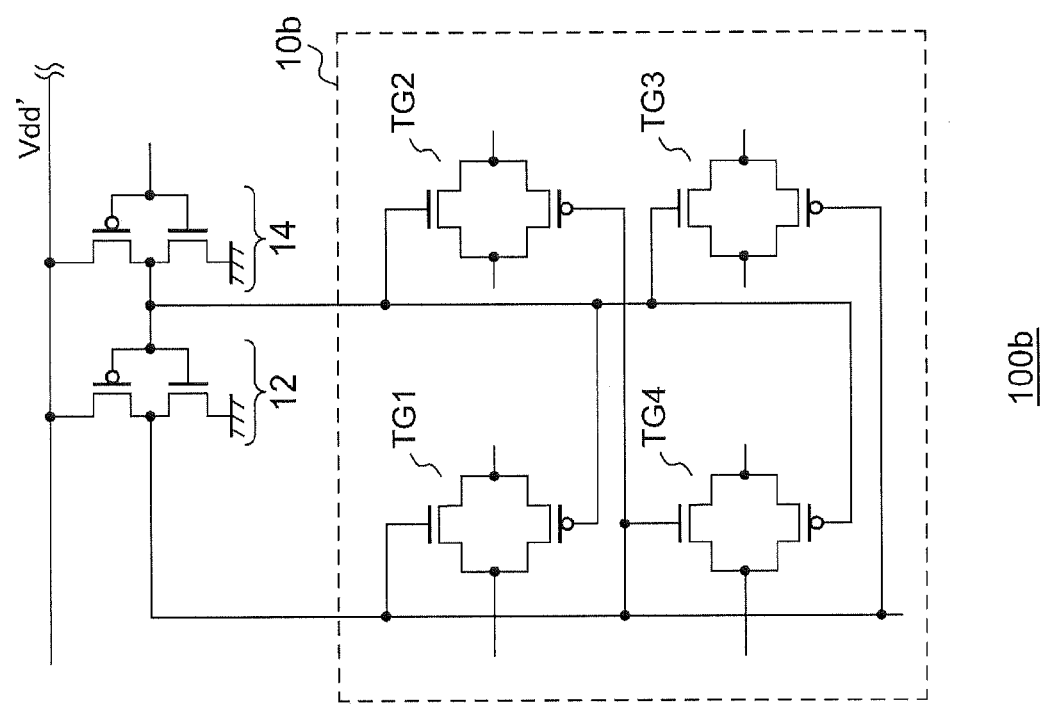
FIG. 4 is a circuit diagram which shows a part of a configuration of a D/A converter according to a third embodiment.

A third embodiment can be understood as being a combination of the first and second embodiments. FIG. 4 is a circuit diagram showing a part of a configuration of a D/A converter 100b according to the third embodiment. A power supply unit of the D/A converter 100b should be configured in the same way as the power supply unit shown in FIG. 3. Accordingly, the power supply unit of the D/A converter 100b is not shown in the drawing.

In the D/A converter 100b, each switch that is a component of a switch circuit 10b is configured as a transfer gate TG. The transfer gate TG includes a P-channel MOSFET and an N-channel MOSFET. The second power supply voltage Vdd' is supplied to the upper power supply terminal of each of a first inverter 12 and the second inverter 14. The ground voltage 0 V is supplied to the lower power supply terminal of each of the first inverter 12 and the second inverter 14.

With such a third embodiment, such an arrangement provides a high PSRR while providing a reduction in the on resistance of each switch that is a component of the switch circuit 10.

Description has been made regarding the present invention with reference to the embodiments. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Figure 5:
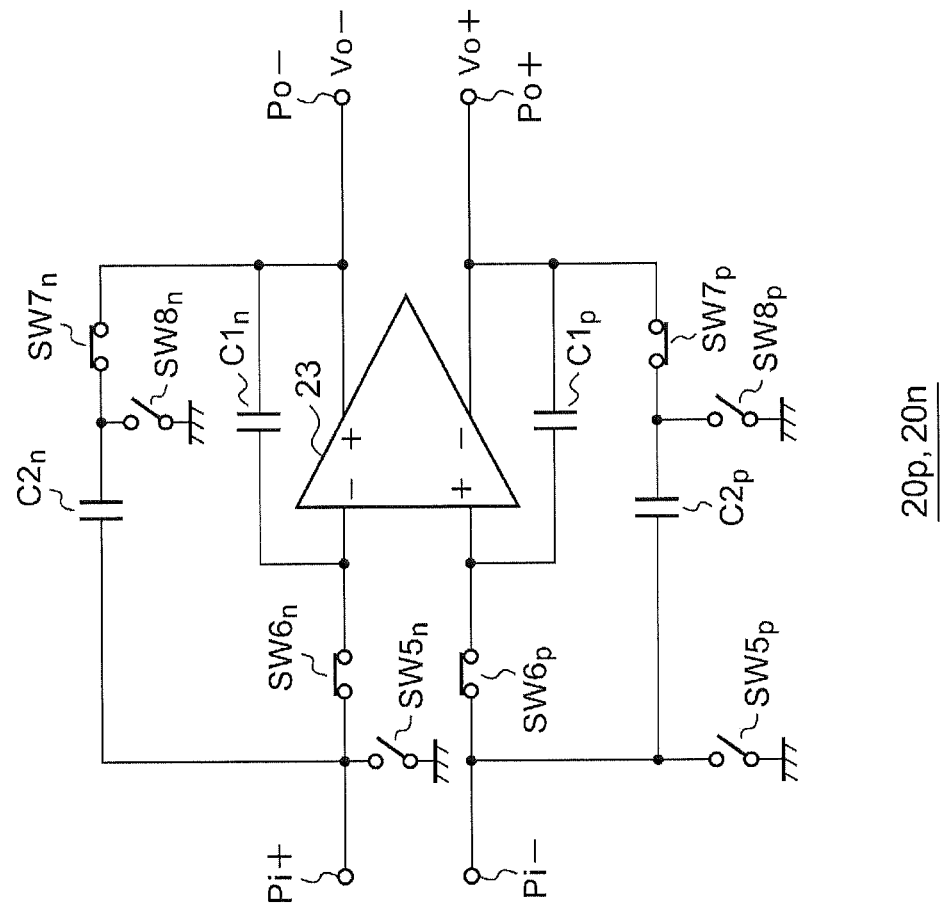
FIG. 5 is a circuit which shows a modification of a first calculation unit and a second calculation unit shown in FIG. 2.

The topology of the capacitors and switches shown in FIG. 2 has been described for exemplary purpose only. Also, the present invention can be applied to various kinds of switched capacitor type D/A converters having known or prospectively available topologies. FIG. 5 is a circuit diagram which shows a modification of the first calculation unit 20p and the second calculation unit 20n shown in FIG. 2. In FIG. 5, the first calculation unit 20p and the second calculation unit 20n are configured such that they share a single differential amplifier 23, instead of employing the two operational amplifiers. The topology of the capacitors and the switches is the same as that shown in FIG. 2.

Description has been made in the embodiments regarding a differential output D/A converter. Also, the present invention can be applied to a single-ended D/A converter.

While the preferred embodiments of the present invention have been described using specific terms, such description is for illustrative purposes only, and it is to be understood that changes and variations may be made without departing from the spirit or scope of the appended claims.

What is claimed is:

1. A switched capacitor type D/A converter configured to receive m-bit (m represents an integer) input data, and to output an analog signal that corresponds to the value of the input data, the switched capacitor type D/A converter comprising:

m switch circuits provided to respective bits of the input data, each switch circuit comprising a first switch group and a second switch group, each switch in the first switch group being on state when the corresponding bit of the input data is 1 and being off state when the corresponding bit of the input data is 0, each switch in the second switch group being on state when the corresponding bit of the input data is 0 and being off state when the corresponding bit of the input data is 1;

a first inverter configured to output a gate signal to each switch in the first switch group; and a second inverter configured to output a gate signal to each switch in the second switch group, wherein each switch in the first switch group and the second switch group is configured as a P-channel MOSFET (Metal Oxide Semiconductor Field Effect Transistor), and wherein a ground voltage is applied to a lower power supply terminal of each of the first inverter and the second inverter.

2. A switched capacitor type D/A converter according to claim 1, wherein the back gate of the P-channel MOSFET is fixed at an electric potential that is lower than the voltage to be input to an upper power supply terminal of each of the first inverter and the second inverter.

3. A switched capacitor type D/A converter according to claim 1, wherein an output voltage of a DC/DC converter is supplied to an upper power supply terminal of each of the first inverter and the second inverter.

4. A switched capacitor type D/A converter configured to receive m-bit (m represents an integer) input data, and to output an analog signal that corresponds to the value of the input data, the switched capacitor type D/A converter comprising:

m switch circuits provided to respective bits of the input data, each switch circuit comprising a first switch group and a second switch group, each switch in the first switch group being on state when the corresponding bit of the input data is 1 and being off state when the corresponding bit of the input data is 0, each switch in the second switch group being on state when the corresponding bit of the input data is 0 and being off state when the corresponding bit of the input data is 1;

a first inverter configured to output a gate signal to each switch in the first switch group;

a second inverter configured to output a gate signal to each switch in the second switch group;

a band gap reference circuit configured to generate a reference voltage; and a linear regulator configured to output a voltage that corresponds to the reference voltage, wherein each switch in the first switch group and the second switch group is configured as an N-channel MOSFET (Metal Oxide Semiconductor Field Effect Transistor), and wherein an output voltage of the linear regulator is supplied to an upper power supply terminal of each of the first inverter and the second inverter.

5. A switched capacitor type D/A converter configured to receive m-bit (m represents an integer) input data, and to output an analog signal that corresponds to the value of the input data, the switched capacitor type D/A converter comprising:

m switch circuits provided to respective bits of the input data, each switch circuit comprising a first transfer gate group and a second transfer gate group, each transfer gate in the first transfer gate group being on state when the corresponding bit of the input data is 1 and being off state when the corresponding bit of the input data is 0, each transfer gate in the second transfer gate group being on state when the corresponding bit of the input data is 0 and being off state when the corresponding bit of the input data is 1;

a first inverter configured to output a gate signal to each N-channel MOSFET in the first transfer gate group and each P-channel MOSFET in the second transfer gate group;

a second inverter configured to output a gate signal to each P-channel MOSFET in the first transfer gate group and each N-channel MOSFET in the second transfer gate group;

a band gap reference circuit configured to generate a reference voltage; and a linear regulator configured to receive the reference voltage, wherein a ground voltage is applied to a lower power supply terminal of each of the first inverter and the second inverter, and wherein an output voltage of the linear regulator is applied to an upper power supply terminal of each of the first inverter and the second inverter.

6. A switched capacitor type D/A converter according to claim 1, wherein the input data is in the form of a digital audio signal.

7. A switched capacitor type D/A converter according to claim 4, wherein the input data is in the form of a digital audio signal.

8. A switched capacitor type D/A converter according to claim 5, wherein the input data is in the form of a digital audio signal.

* * * * *